(12) United States Patent
Saito

(10) Patent No.: US 7,298,051 B2
(45) Date of Patent: Nov. 20, 2007

(54) SEMICONDUCTOR ELEMENT AND MANUFACTURING METHOD THEREOF

(75) Inventor: Hitoshi Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/208,549

(22) Filed: Aug. 23, 2005

(65) Prior Publication Data

US 2006/0267222 A1 Nov. 30, 2006

(30) Foreign Application Priority Data

May 30, 2005 (JP) ............... 2005-157538

(51) Int. Cl.
*H01L 29/40* (2006.01)
(52) U.S. Cl. ...................... 257/784; 257/786
(58) Field of Classification Search ........... 257/784, 257/786
See application file for complete search history.

(56) References Cited

U.S. PATENT DOCUMENTS

| | | | | |
|---|---|---|---|---|
| 5,739,587 A | * | 4/1998 | Sato ........................ | 257/758 |
| 5,986,343 A | * | 11/1999 | Chittipeddi et al. ........ | 257/758 |
| 6,100,589 A | * | 8/2000 | Tanaka .................... | 257/758 |
| 6,552,438 B2 | * | 4/2003 | Lee et al. ................. | 257/784 |
| 6,791,196 B2 | * | 9/2004 | Kwon et al. .............. | 257/784 |
| 6,818,540 B2 | * | 11/2004 | Saran et al. .............. | 438/612 |

FOREIGN PATENT DOCUMENTS

| | | |
|---|---|---|
| JP | 10-64945 | 3/1998 |
| JP | 2001-358169 | 12/2001 |
| JP | 2002-208610 | 7/2002 |

\* cited by examiner

*Primary Examiner*—Roy Karl Potter
(74) *Attorney, Agent, or Firm*—Westerman, Hattori, Daniels & Adrian, LLP.

(57) ABSTRACT

In a semiconductor element, if a crack is generated inside a bonding pad, the crack does not propagate inside the semiconductor element. The semiconductor element has an electrode on a surface thereof. A wiring layer is formed inside the semiconductor element. A conductive layer is formed separate from the wiring layer so as to form a surface of the electrode. A plurality of pole-like members are formed of a conductive material and extending between the wiring layer and the conductive layer and arranged adjacent to each other. The insulating layer is formed of an insulating material filled between the plurality of pole-like members. A frame member extends between the wiring layer and the conductive layer so as to surround the plurality of pole-like members and the insulating layer together.

7 Claims, 6 Drawing Sheets

SEMICONDUCTOR ELEMENT AND MANUFACTURING METHOD THEREOF

BACKGROUND OF THE INVENTION

1. Field of the Invention

The present invention generally relates to a semiconductor element and a manufacturing method thereof and, more particularly, to a semiconductor element having a bonding par or a bump pad or a probing pad that serves as a connection terminal of the semiconductor element in a semiconductor device and a manufacturing method of such a semiconductor element.

2. Description of the Related Art

Generally, a semiconductor element incorporated in a semiconductor device is provided with a plurality of electrodes for acquiring an electric contact with an external device. For example, if the electrodes serve as connection pads of bonding wires, those electrodes are referred to as bonding pads. If the electrodes serve as connection pads of bumps, those electrodes are referred to as bump pads. Additionally, if the electrodes serve aw connection pads for contacting with probe needles, those electrodes are referred to as probing pads. Hereinafter, the bonding pads are explained below as a representative of the bonding pads, the bump pads and the probing pads.

FIG. 1 is a perspective view showing a part of an integrated circuit package (semiconductor device) in which a semiconductor element having a plurality of bonding pads are incorporated. As shown in FIG. 1, the bonding pads 6a of the semiconductor element 6 mounted on a die stage 4 of a lead frame 2 within the semiconductor device are connected to inner leads 2a of the lead frame 2 by bonding wires 8.

FIG. 2 is a plan view of the bonding pads shown in FIG. 1. FIG. 3 is a cross-sectional view taken along a line III-III in FIG. 2.

As shown in FIG. 2 and FIG. 3, generally, the bonding pads 6a formed in the semiconductor element have a structure in which many conductive plugs 16, which are made of tungsten or the like and arranged in a matrix pattern, are formed on a lower wiring layer 14 made of aluminum or the like, and an upper conductive layer 18 made of aluminum or the like is formed on the conductive plugs 16. Between the lower wiring layer 14 and the upper conductive layer 18, an insulating layer 20 is formed around the conductive plug 16.

It should be noted that the lower wiring layer 14 is formed on an interlayer insulating film 12 formed on a semiconductor substrate 10, and serves as an internal wiring of the semiconductor element. Additionally, an outer circumferential portion of the upper conductive layer 18 is covered by a cover film 22, and the upper conductive layer 18 is exposed in openings formed in the cover film 22.

Here, in a process of forming the semiconductor element, for example, an electric characteristic test is performed by performing an electric test so as to determine whether or not the semiconductor device is good or defective. In this case, is it necessary to bring test probe pins into contact with the bonding pads 6a (upper conductive layer 18). When the test probe pins are pressed onto the upper conductive layer 18, a stress is concentrated into the insulating layer, which is hard and brittle as compared to the upper aluminum layer and the conductive plugs 16. Due to the stress concentration, there may be a case in which a crack is generated in the insulating layer 20 between the conductive plugs 16.

Such a crack does not propagate to the conductive plug 16, and ends when the crack reaches the conductive plug 16.

However, the conductive plugs 16 are arranged in a matrix pattern, and in the cross-section shown in FIG. 4, the crack may propagate within the insulating layer 20 without running into the conductive plugs 16.

Moreover, a flaw may be formed on the upper conductive layer 18 by the test probe pins being pressed onto the upper conductive layer 18. Such a flaw may propagate within the insulating layer 20. Then, if a water component enters the flaw, the water component enters inside the semiconductor element, which may cause a moisture resistance defect.

Thus, in order to solve the above-mentioned problem, there is suggested a bonding pad having a structure in which the conductive plugs and the portions of the insulating layer are exchanged so as to make a grid-like conductive portion 16A and island-like insulating layer 20 as shown in FIG. 5 and FIG. 6 (for example, refer to Patent Document 1). It should be noted that FIG. 5 is a plane view of the bonding pad 6Aa having the grid-like conductive portion 16A, and FIG. 6 is a cross-sectional view taken along a line VI-VI of FIG. 5.

That is, between the upper conductive layer 18 and the lower wiring layer 14, the grid-like conductive portion 16A corresponding to the conductive plugs is formed of tungsten or the like, and an insulating material is filled in each square portion within the grid-like conductive portion 16A so as to form the insulating layer 20. According to such a structure, the insulating layer 20, which tends to generate a crack, is surrounded by wall surfaces of the grid-like conductive portion 16A. Accordingly, is a crack is generated in the insulating layer 20 corresponding to one square portion, the crack does not propagate to the insulating layer 20 of other square portions or the insulating layer 20 outside the grid-like conductive portion 16A.

The following documents relate to the above-mentioned background art of the present invention.

Patent Document 1: Japanese Laid-Open Patent Application No. 2002-208610

Patent Document 2: Japanese Laid-Open Patent Application No. 10-64945

The above-mentioned grid-like conductive portion 16A can be formed by forming portions corresponding to openings of the grid pattern (that is, the island-like insulating layer 20) and filling tungsten or the like between the island-like insulating layer 20. However, since the insulating material forming the insulating layer 20 has a pole shape, a contact area with the lower wiring layer 14 is small. Thus, there may be a problem in that the pole-like insulating layer 20 separate and fall off from the lower wiring layer 14 as shown in FIG. 7 when performing etching, ashing, post processing, cleaning, and drying in the forming process of the insulating layer 20 or when performing cleaning or drying in a subsequent process. It should be noted that, in FIG. 7, the island like insulating layer 20 is indicated not as a square pole but a cylindrical pole. Although the island-like insulating layer 20 is indicated as a square pole in FIG. 4 and FIG. 5, it may be a shape close to cylindrical pole when forming in practice.

In addition, the may happen a problem in that the conductive material cannot be properly filled in a portion indicated by a reference numeral 38 in FIG. 8 or a recess is formed when filling the conductive material such as tungsten or the like around the island-like insulating layer 20, which cannot acquire a good coverage. It should be noted that the island-like insulating layer 20 is indicated as a cylindrical pole also in FIG. 8.

SUMMARY OF THE INVENTION

It is a general object of the present invention to provide an improved and useful semiconductor element and manufacturing method thereof in which the above-mentioned problems are eliminated.

A more specific object of the present invention is to provide a semiconductor element having a structure in which, if a crack is generated inside a bonding pad, the crack does not propagate inside the semiconductor element.

In order to achieve the above-mentioned objects, there is provided according to one aspect of the present invention a semiconductor element having an electrode on a surface thereof, the semiconductor element comprising: a wiring layer formed inside the semiconductor element; a conductive layer formed separate from the wiring layer so as to form a surface of the electrode; a plurality of pole-like members formed of a conductive material and extending between the wiring layer and the conductive layer and arranged adjacent to each other; an insulating layer formed of an insulating material filled between the plurality of pole-like members; and a frame member extending between the wiring layer and the conductive layer so as to surround the plurality of pole-like members and the insulating layer together.

Additionally, there is provided according to another aspect of the present invention a manufacturing method of a semiconductor element having an electrode on a surface thereof, the manufacturing method comprising: forming a plurality of pole-like members and a frame member on a wiring layer inside the semiconductor element so that the frame member surrounds the plurality of pole-like members; forming an insulating layer by filling an insulating material between the pole-like members; and forming a conductive layer on the plurality of pole-like members, the insulating member and the frame member so as to make a surface of the conductive layer as a surface of the electrode. The frame member may be formed by the same material as the pole-like members.

According to the present invention, even if a crack is generated in the insulating layer under the electrode due to a stress applied onto the electrode when being contacted by a test probe pin, performing wire-bonding or forming a bump, propagation of the crack is prevented by the frame member and the crack does not propagate inside the semiconductor element. Accordingly, generation of a moisture resistance defect due to a water component entering inside the semiconductor element is prevented. Additionally, since the insulating layer in the electrode structure is in a continuous form connected with each other, a portion of the insulating layer cannot fall off in the manufacturing process.

Additionally, according to the present invention, the pole-like members are not only surrounded by the frame member but also completely surrounded in vertical directions and horizontal directions together with the insulating layer by the wiring layer, the intermediate conductive layer, the conductive layer and the frame member. Thus, even if a crack propagates in vertical directions, the crack cannot propagate outside the bonding pad structure, and the crack is confined within the bonding pad structure.

Other objects features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of an embodiment according to the present invention.

Figure 1:
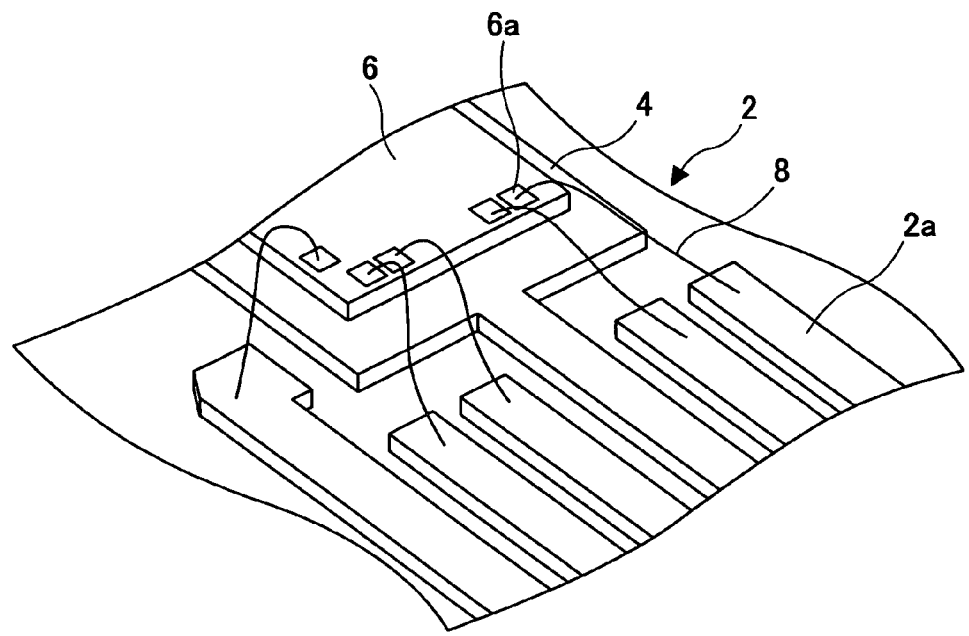
FIG. 1 is a perspective view of a part of an integrated circuit package in which a semiconductor element having a plurality of bonding pads are incorporated.
Figure 2:
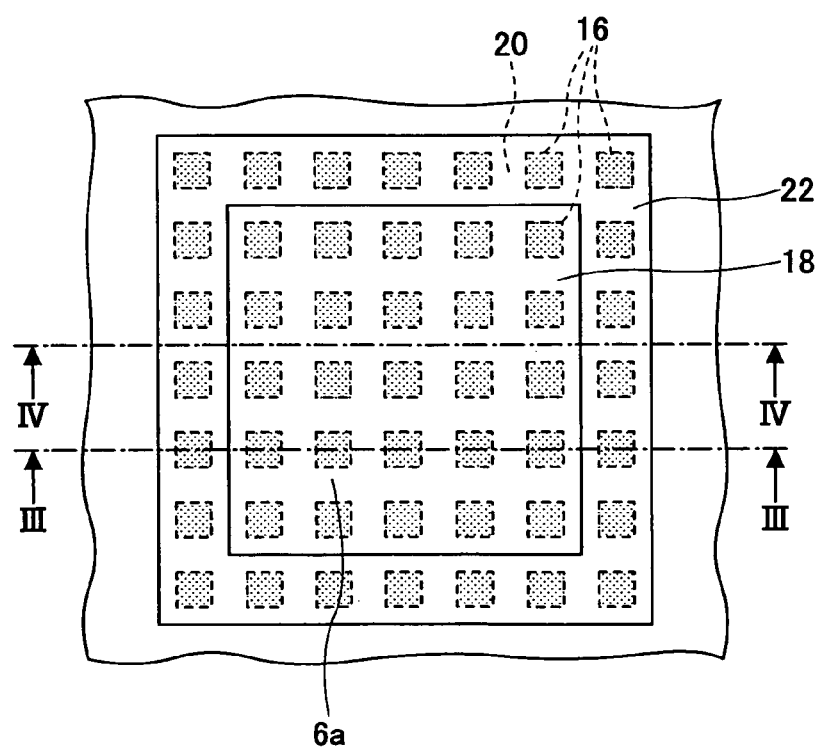
FIG. 2 is a plan view of the bonding pads shown in FIG. 1.
Figure 3:
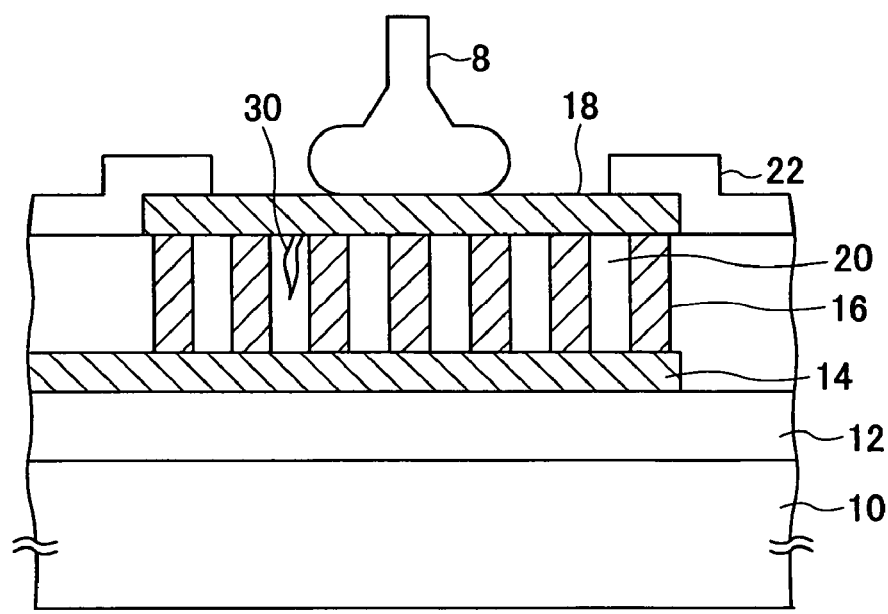
FIG. 3 is a cross-sectional view taken along a line III-III in FIG. 2.
Figure 4:
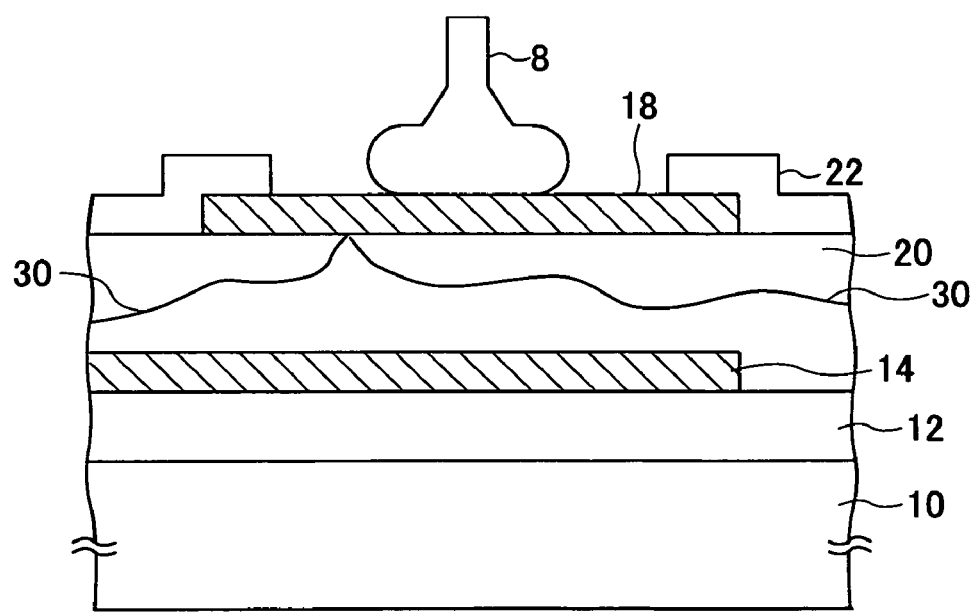
FIG. 4 is a cross-sectional view taken along a line IV-IV of FIG. 2.
Figure 5:
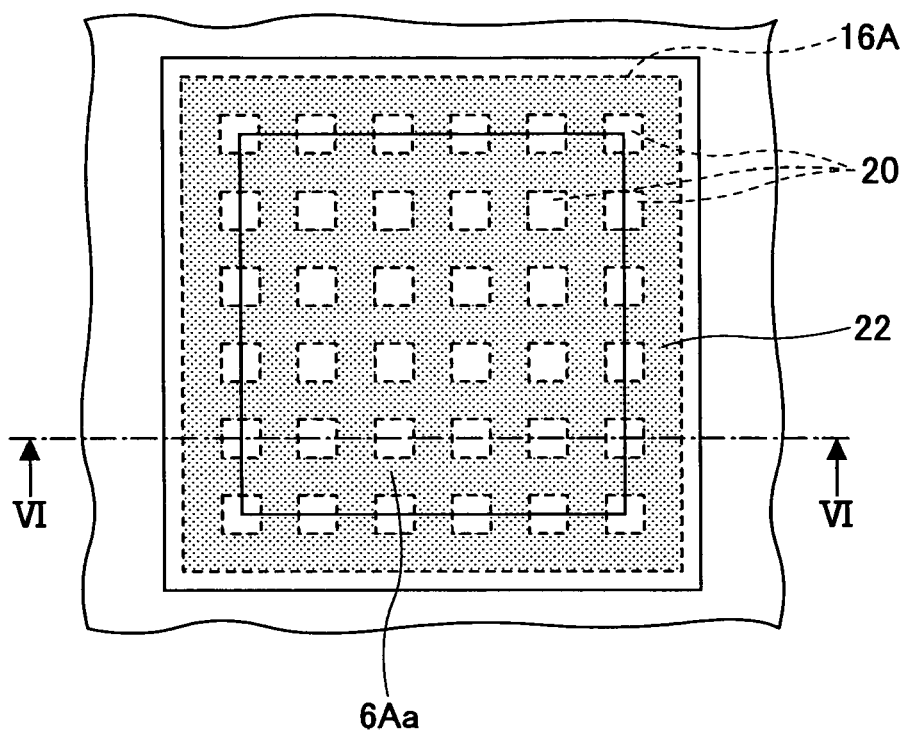
FIG. 5 is a plane view of a bonding pad having a grid-like conductive portion.
Figure 6:
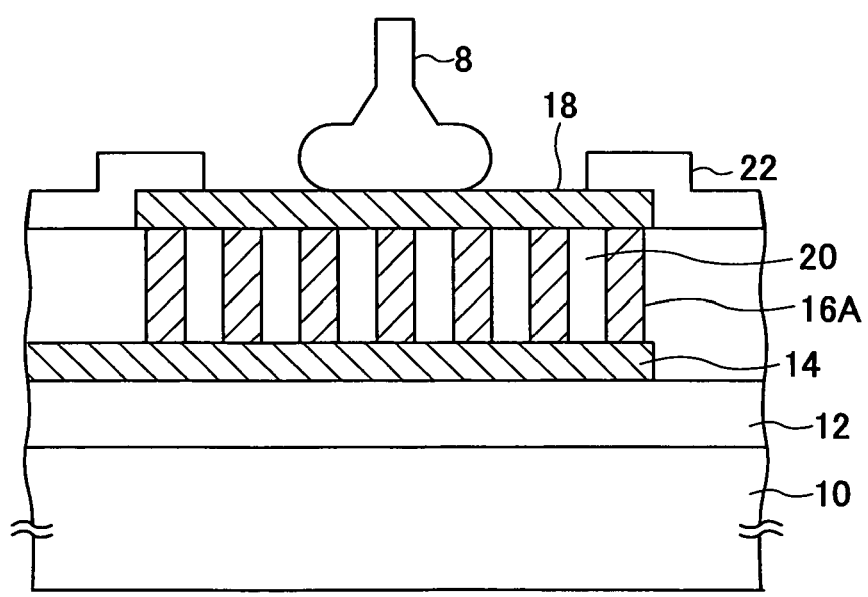
FIG. 6 is a cross-sectional view taken along a line VI-VI of FIG. 5.
Figure 7:
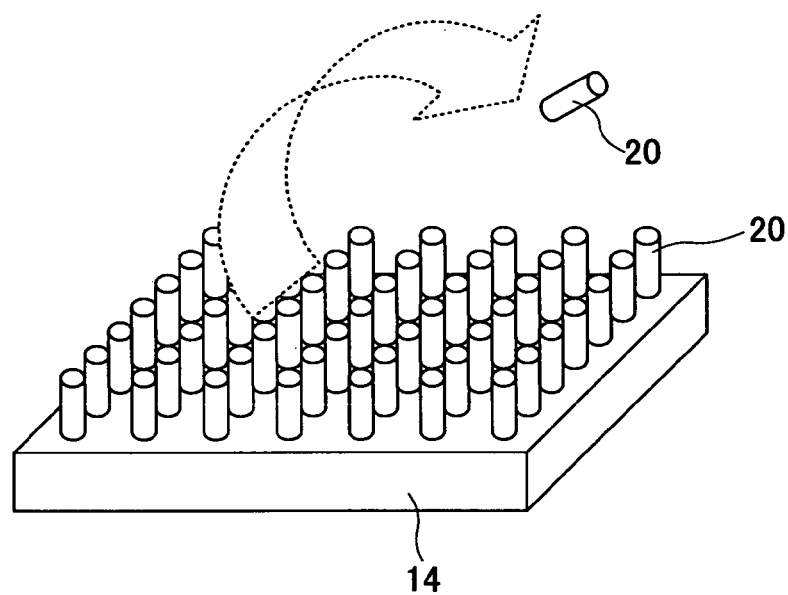
FIG. 7 is an illustration showing a state of an insulating layer shown in FIG. 5.
Figure 8:
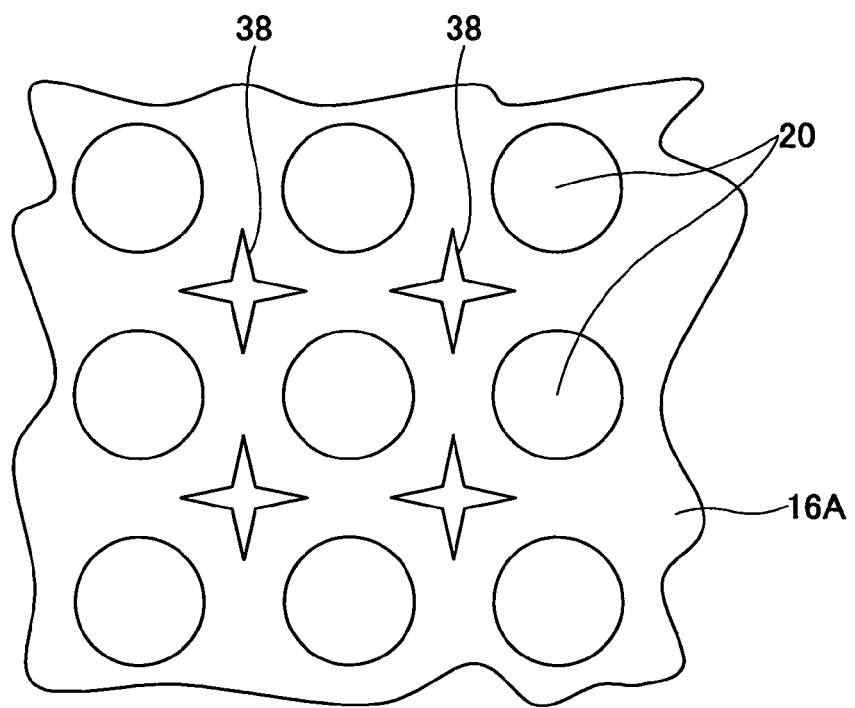
FIG. 8 is an illustration showing a art of a grid-like member shown in FIG. 5.
Figure 9:
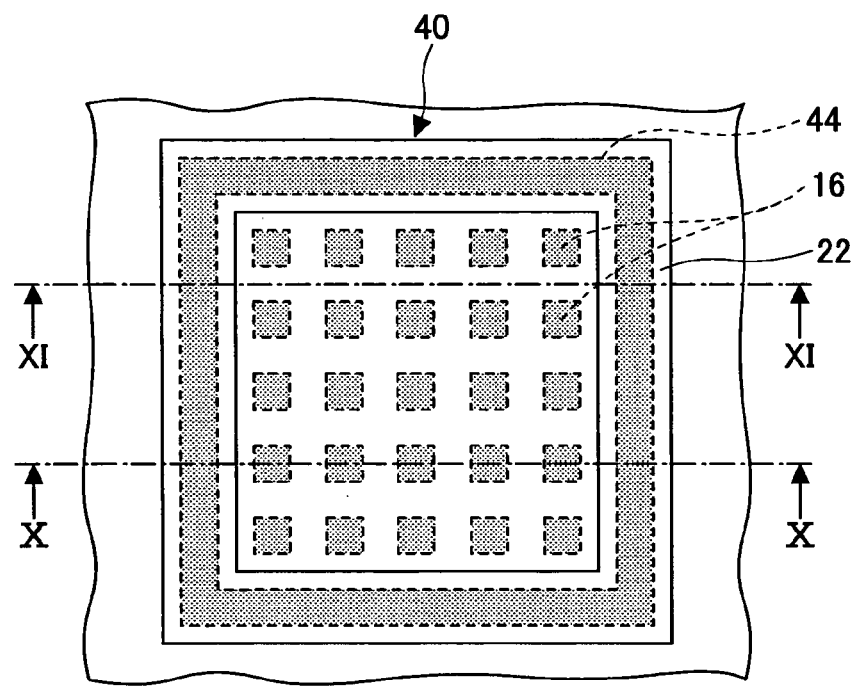
FIG. 9 is a plan view of a bonding pad of a semiconductor element according to an embodiment of the present invention.
Figure 10:
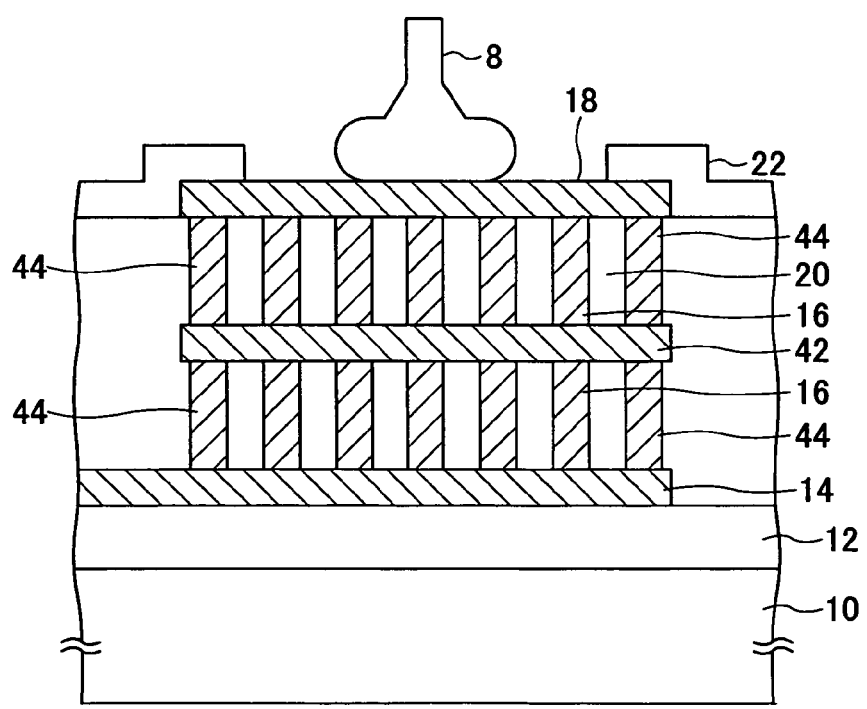
FIG. 10 is a cross-sectional view taken along a line X-X of FIG. 9.
Figure 11:
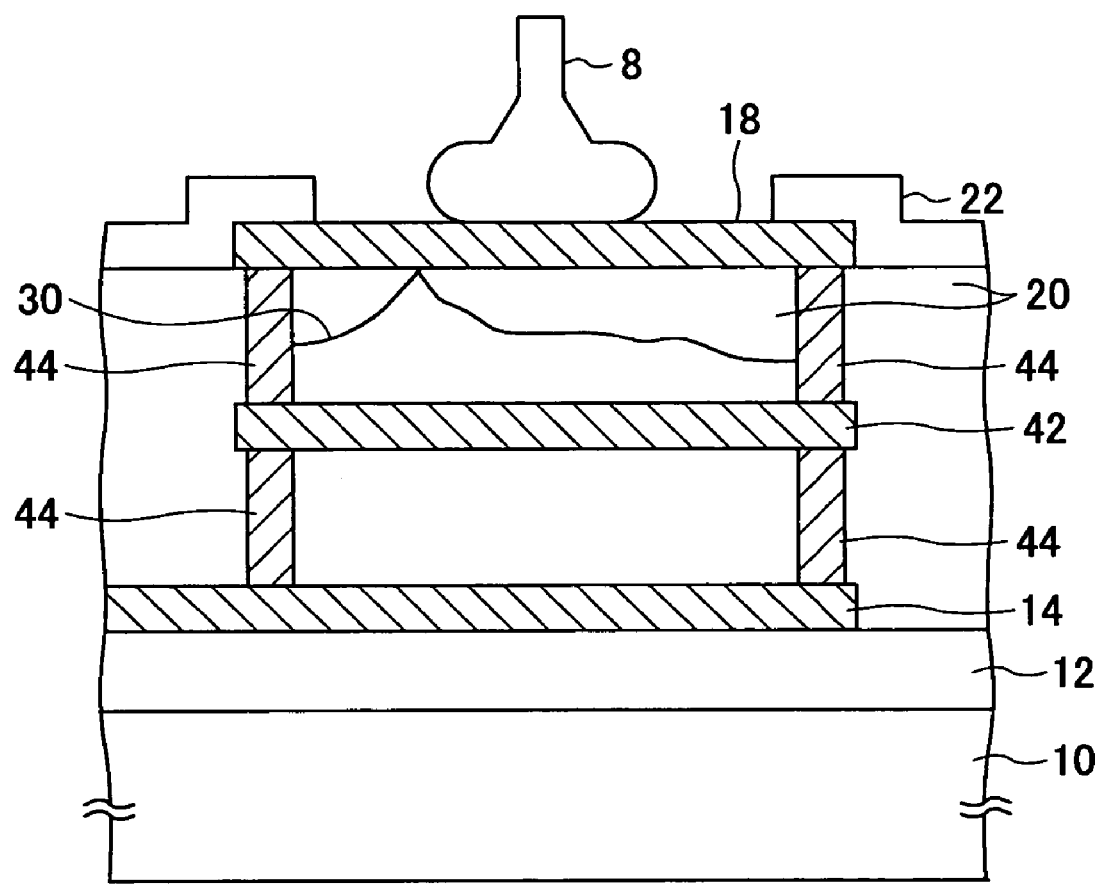
FIG. 11 is a cross-sectional view taken along a line XI-XI of FIG. 9.

FIG. 9 is a plan view of a bonding pad portion according to an embodiment of the present invention. FIG. 10 is a cross-sectional view taken along a line X-X of FIG. 9. FIG. 11 is a cross-sectional view taken along a XI-XI of FIG. 9. In FIGS. 9 through 11, parts that are the same as the parts shown in FIG. 2 and FIG. 3 are given the same reference numerals.

In the present embodiment, a bonding pad 40 has a two-stage structure, and as shown in FIG. 10, an intermediate conductive layer 42 is provided between upper and lower conductive plugs 16. The conductive plugs are pole-like members formed of a conductive material. In the present embodiment, the upper conductive layer 18 and the intermediate conductive layer 42 are electrically connected to each other by the upper conductive plugs 16, which are pole-like members formed by a conductive material such as tungsten or the like. Similarly, the intermediate conductive layer 42 and the lower wiring layer 14 are electrically connected to each other by the lower conductive plugs 16, which are pole-like members formed by a conductive material such as tungsten or the like. An externally exposed surface of the upper conductive layer 18 serves as a bonding surface to which a bonding wire 8 is joined.

Although the bonding pad 40 is configured to be the two-stage structure as mentioned above in the present embodiment, the bonding pad may have a single-stage structure or a multi-stage structure having more than 3 stages. A number of stages of the bonding pad can be determined in accordance with a distance between the upper conductive layer 18 and the interlayer insulating film 12 formed on the semiconductor substrate 10.

In the present embodiment, as shown in FIG. 9, an outermost circumferential portion of the conductive plugs 16 positioned arranged in a matrix form is configured as a frame member 44, which is continuous over an entire circumference. In the present embodiment, the frame member 44 is formed of the same material as the conductive plugs 16, such as tungsten or the like, and, thereby, the frame member 40 can be formed in the same process of forming the tungsten plugs 16. Accordingly, similar to the conductive plugs 16, the frame member 44 also serves as a member that electrically connects the lower wiring layer 14 and the upper conductive layer with each other.

It should be noted that it is preferable to use tungsten (W), copper (Cu), aluminum (Al) or the like as a conductive material to form the conductive plugs 16 and the frame member 44. Additionally, as an insulating material to form an insulating layer 20, there are silicon oxide (SixOy), NSG, Silk, a low-dielectric-constant material (low-k) material, etc.

A width of the frame member 44 is preferably set to substantially the same as the width of each conductive plug 16. For example, if a 0.35-µm rule is applied as a design rule of the semiconductor device, the width of the frame member 44 is preferably set to about 0.45 µm. If a 0.18-µm rule is applied as a design rule, the width of the frame member 44 is preferably set to about 0.25 µm. If a 0.09-µm rule is applied, the width of the frame member 44 is preferably set to about 0.15 µm.

Additionally, it is preferable that an outline of the frame member 44 is substantially equal to an outline of the upper conductive layer 18 forming a bonding surface so that a lot of conductive plugs 16 can be formed inside the frame member 44.

In above-mentioned structure, the conductive plugs 16 and the insulating layer 20, which is made of an insulating material, provided between the conductive plugs 16 are surrounded by the frame member 44. Accordingly, even if a crack is generated in the insulating layer provided between the conductive plugs 16, the crack cannot propagate outside the frame member 44 as shown in FIG. 11. It can be appreciated that the propagation of the crack 30 is stopped by the frame member 44 in the structure according to the present embodiment as shown in FIG. 11, while the crack 30 generated in the insulating layer 20 propagates inside the semiconductor element in FIG. 3 which shows a conventional structure.

As mentioned above, according to the present embodiment, even if a crack is generated in an insulating layer inside a bonding pad by a mechanical stress applied to the bonding pad when contacting a test probe pin or performing wire-bonding, the crack does not propagate inside the semiconductor element. Thus, generation of a moisture resistance defect due to a water component entering inside the semiconductor element along the crack is. Additionally, since the insulating layer 20 in the bonding pad structure is not an island-like form but in an interconnected form, a portion of the insulating layer does not fall off.

Moreover, according to the present embodiment, the conductive plugs 16 are not only surrounded by the frame member 44 but also completely surrounded in vertical directions and horizontal directions together with the insulating layer 20 by the lower wiring layer 14, the intermediate conductive layer 42, the upper conductive layer 18 and the frame member 44. Thus, even if a crack is generated, the crack cannot propagate outside the bonding pad structure, which confines the crack within the bonding pad structure (inside the frame member).

It should be noted that the frame member 44 is formed of the same conductive material as the conductive plugs 16 in the present embodiment. Since the conductive material is, for example, a metal which is softer than the insulating material forming the insulating layer 20, there are advantages in that it is suitable for a material to stop propagation of a crack and the frame member 44 can be formed in the same process as the process of forming the conductive plugs 16. However, it is not always necessary to form the frame member 44 by a conductive material, and the frame member 44 may be formed by a relatively flexible insulating material. As such an insulating material, there are, for example, aluminum oxide (AlxOy), titanium aluminum nitride (TixAlyNz), etc.

In order to form the above-mentioned structure of the bonding pad, first, the conductive plugs 16 and the frame member 44 are formed on the lower wiring layer 14 so that the frame member 44 surrounds the conductive plugs 16, and, then, the insulating layer 20 is formed by filling an insulating material between the conductive plugs 16, and, thereafter, the upper conductive layer 18 is formed on the conductive plugs 16, the insulating layer 20 and the frame member 44. Thereby, the surface of the upper conductive layer 18 can be made as a bonding surface of the bonding pad.

The present invention is not limited to the specifically disclosed embodiments, and variations and modifications may be made without departing from the scope of the present invention.

The present application is based on Japanese priority application No. 2005-157538 filed May 30, 2005, the entire contents of which are hereby incorporated herein by reference.

What is claimed is:

1. A semiconductor element having an electrode on a surface thereof, the semiconductor element comprising:
   a wiring layer formed inside the semiconductor element;
   a conductive layer formed separate from the wiring layer so as to form a surface of the electrode;
   a plurality of pole-like members formed of a conductive material and extending between said wiring layer and the conductive layer and arranged adjacent to each other;
   an insulating layer formed of an insulating material filled between the plurality of pole-like members; and
   a frame member extending between said wiring layer and said conductive layer so as to surround said plurality of pole-like members and said insulating layer together,
   wherein an outer configuration of said conductive layer is equal to or larger than an outer configuration of said frame member, and
   said insulating layer is entirely and completely enclosed in a space defined by said conductive layer, said wiring layer and said frame member without any openings.

2. The semiconductor element as claimed in claim 1, wherein said frame member is formed of said conductive material that forms said pole-like members.

3. The semiconductor element as claimed in claim 1, wherein said frame member is formed of a material having a higher flexibility than said insulating material forming said insulating layer.

4. A semiconductor element having an electrode on a surface thereof, the semiconductor element comprising:
   a wiring layer formed inside the semiconductor element;
   a conductive layer formed separate from the wiring layer so as to form a surface of the electrode;
   a plurality of pole-like members formed of a conductive material and extending between said wiring layer and the conductive layer and arranged adjacent to each other;

an insulating layer formed of an insulating material filled between the plurality of pole-like members; and a frame member extending between said wiring layer and said conductive layer so as to surround said plurality of pole-like members and said insulating layer together; wherein an outline of said frame member is substantially equal to an outline of said conductive layer.

5. The semiconductor element as claimed in claim 1, wherein said pole-like members are arranged in a matrix form.

6. The semiconductor element as claimed in claim 1, wherein an intermediate conductive layer is provided between said wiring layer and said conductive layer; said pole-like members includes first pole-like members extending between said wiring layer and said intermediate conductive layer and second pole-like layers extending between said intermediate conductive layer and said conductive layer; and said frame member includes a first frame member extending between said wiring layer and said intermediate conductive layer and a second frame member extending between said intermediate conductive layer and said conductive layer.

7. The semiconductor element as claimed in claim 6, wherein said first and second frame members are formed of said conductive material that forms said first and second pole-like members.

* * * * *